United States Patent [19]

Koo et al.

[11] Patent Number: 4,591,786
[45] Date of Patent: May 27, 1986

[54] FIBER-OPTIC MAGNETIC GRADIOMETER WITH VARIABLE MAGNETIC BIASING FIELDS

[75] Inventors: Kee P. Koo, Alexandria; George H. Sigel, Jr., Great Falls, both of Va.

[73] Assignee: The United States of America as represented by the Secretary of the Navy, Washington, D.C.

[21] Appl. No.: 641,656

[22] Filed: Aug. 17, 1984

[51] Int. Cl.[4] .............. G01R 33/022; G01R 33/023; G01B 9/02
[52] U.S. Cl. .................................... 324/244; 324/96; 324/260; 350/375; 356/345
[58] Field of Search ............. 324/244, 249, 260–262, 324/96, 202; 350/96.15, 96.29, 375; 356/345; 250/227, 231 R; 73/1 R

[56] References Cited

U.S. PATENT DOCUMENTS

| | | | |
|---|---|---|---|
| 4,112,367 | 9/1978 | Hepner et al. | 324/244 |
| 4,147,979 | 4/1979 | Banes et al. | 324/244 |
| 4,264,126 | 4/1981 | Sheem | 350/96.15 |
| 4,368,430 | 1/1983 | Dale et al. | 324/244 |
| 4,376,248 | 3/1983 | Giallorenzi et al. | 250/227 |
| 4,471,219 | 9/1984 | Giallorenzi | 324/244 X |
| 4,529,876 | 7/1985 | Walker | 250/227 |

FOREIGN PATENT DOCUMENTS 2014291  7/1971  Fed. Rep. of Germany ........ 324/96

OTHER PUBLICATIONS

K. P. Koo and G. H. Sigel, Jr., A Fiber-Optic Magnetic Gradiometer, Journal of Lightwave Tech., vol. LT-1, No. 3, Sep. 1983, pp. 506–513.

K. P. Koo and G. H. Sigel, Jr., Characteristics of Fiber-Optic Magnetic-Field Sensors Employing Metallic Glasses, Optic Letters, vol. 7, No. 7, Jul. 1982, pp. 334–336.

K. P. Koo, A. B. Tveten, and A. Dandridge, Passive Stabilization Scheme for Fiber Interferometers Using (3×3) Fiber Directional Couplers, Applied Phys. Lett. 41(7), Oct. 1, 1982, pp. 616–618.

D. A. Jackson, R. Priest, A. Dandridge, and A. B. Tveten, Elimination of Drift in a Single-Mode Optical Fiber Interferometer Using a Piezoelectrically Stretched Coiled Fiber, Applied Optics, vol. 19, Sep. 1, 1980, pp. 2926–2929.

*Primary Examiner*—Gerard R. Strecker
*Assistant Examiner*—Warren S. Edmonds
*Attorney, Agent, or Firm*—Robert F. Beers; Sol Sheinbein; William T. Ellis

[57] ABSTRACT

A fiber optic magnetic gradiometer for measuring both ac and dc magnetic field gradients. The gradiometer utilizes an optical interferometer with magnetostrictive magnetic field sensing elements in each of the interferometer arms. Ac and dc magnetic field biasing is achieved by disposing each of the magnetic field sensing elements within its own magnetic field coil and utilizing a variable dc current source for applying dc current to each magnetic coil. An ac current source at frequency $w_o$ connected across the circuits for the dc current sources is used in conjunction with a variable attenuator to control the ac bias to the respective magnetic coils. The detected output from the interferometer is processed either by bandpass filters or a spectrum analyzer to obtain the signal component at $w_o$, which is proportional to the external dc gradient magnetic field, and at $w_o + w_s$, (where $w_s$ is external ac magnetic field frequency), which is proportional to the external ac magnetic field gradient.

9 Claims, 8 Drawing Figures

ZERO　　　　$w_0$　　　　$2w_0$
BALANCED

ZERO　　　$w_0-w_s$　$w_0$　$w_0+w_s$　　$2w_0$
WITH $\Delta H_{ext}^{ac}$

ZERO  $w_s$  $w_o-w_s$  $w_o$  $w_o+w_s$  $2w_o$
WITH $(\Delta H_{ext}^{ac}+\Delta H_{ext}^{dc})$

FIBER-OPTIC MAGNETIC GRADIOMETER WITH VARIABLE MAGNETIC BIASING FIELDS

BACKGROUND OF THE INVENTION

The present invention relates generally to magnetometers, and more particularly, to fiber-optic magnetic gradiometers for sensing both ac and dc magnetic-field gradients.

A highly sensitive optical-fiber magnetometer with a minimum detectable magnetic field of $\sim 3 \times 10^{-9}$ Oe for 1 m of sensor fiber was demonstrated in the paper "Characteristics of Fiber-Optic Magnetic Field Sensors Employing Metallic Glasses, by Koo and Sigel, Jr., Optics Letters, Vol. 7, No. 7, July 1982. See also "Optical Fiber Magnetic Field Sensors," by A. Dandridge, A. B. Tveten, G. H. Sigel, Jr., E. J. West, and T. G. Giallorenzi, Electronics Letters, Vol. 16, pp. 408–409, 1980. This new class of fiber interferometric sensors depends on the precise measurement of magnetostrictively induced changes in the optical path length of a metal-jacketed fiber. However, for some applications where small local magnetic perturbations in the presence of a strong spatially uniform background magnetic field are to be measured, a magnetic gradiometer is desired. A magnetic gradiometer is essentially a dual-sensor device which enables a differential magnetic-field measurement between the two sensor heads or arms. As a result, temporal magnetic noises which are spatially uniform across the two sensor heads are suppressed. In an ideal magnetic gradiometer where a differential technique is used, one measures only local spatial variations of magnetic fields with infinite common-mode (background field) rejection capability.

The usefulness of a differential or gradient magnetic-field measuring device depends largely on how well the device can be balanced (zero output) in a uniform field environment. In an interferometric fiber magnetic gradiometer, magnetostrictive materials are used to stretch both arms of the fiber interferometer. To achieve exact balance, the amount of stretch in each of the two fiber arms must be equal. This requires a complete match of the magnetic performance characteristics between the two fiber arms, implying both a tight control on the variation of magnetostrictive responses of the magnetic material and the precise match in the lengths of the two sensor elements. It is obvious that in situ fine tuning of these parameters after device assembly is very desirable if not absolutely necessary.

OBJECTS OF THE INVENTION

Accordingly, it is an object of the present invention to provide an interferometric magnetic gradiometer which can be balanced and trimmed in situ after device assembly.

It is a further object of the present invention to provide a fiber-optic magnetic gradiometer which can measure ac and dc magnetic field gradients and is capable of being balanced for both ac and dc ambient magnetic fields.

Other objects, advantages, and novel features of the present invention will become apparent from the detailed description of the invention, which follows the summary.

SUMMARY OF THE INVENTION

The above and other objects are achieved in a fiber-optic magnetic gradiometer in accordance with the present invention comprising an interferometer including a first optical fiber arm, a second optical fiber arm, each having a first and second ends, input coupling means for coupling light into the first ends of the first and second arms, and output coupling means for coupling light together at the second ends of the first and second arms;

first magnetic means disposed around a portion of the first arm for changing the length of the first arm in accordance with a magnetic field;

first variable magnetic bias means for applying a first dc and ac magnetic bias fields to the first magnetic means, said first ac magnetic bias field having a frequency $w_o$;

second magnetic means disposed around a portion of the second arm for changing the length of the second arm in accordance with a magnetic field;

second variable magnetic bias means for applying a second dc and ac magnetic bias fields to the second magnetic means, said second ac magnetic bias field having a frequency $w_o$;

a control circuit for controlling the dc and ac magnetic bias fields being applied by the first and second variable magnetic bias means;

said first and second magnetic bias means acting to balance out ambient environmental magnetic fields and to compensate for unequal lengths of the first and second arms and for unequal responses by the first and second magnetic means to magnetic fields;

means for detecting the light coupled together at the output coupling means; and means for obtaining the signal components from the output of the detecting means at the ac magnetic bias frequency $w_o$ in order to obtain a signal proportional to the external dc gradient magnetic field, and for obtaining the signal components from the output of the detecting means at one of the frequencies $w_o \pm w_s$, where $w_s$ is the external ac magnetic field frequency, in order to obtain a signal proportional to the external ac gradient magnetic field.

DETAILED DESCRIPTION OF THE PREFERRED EMBODIMENT

Figure 1:
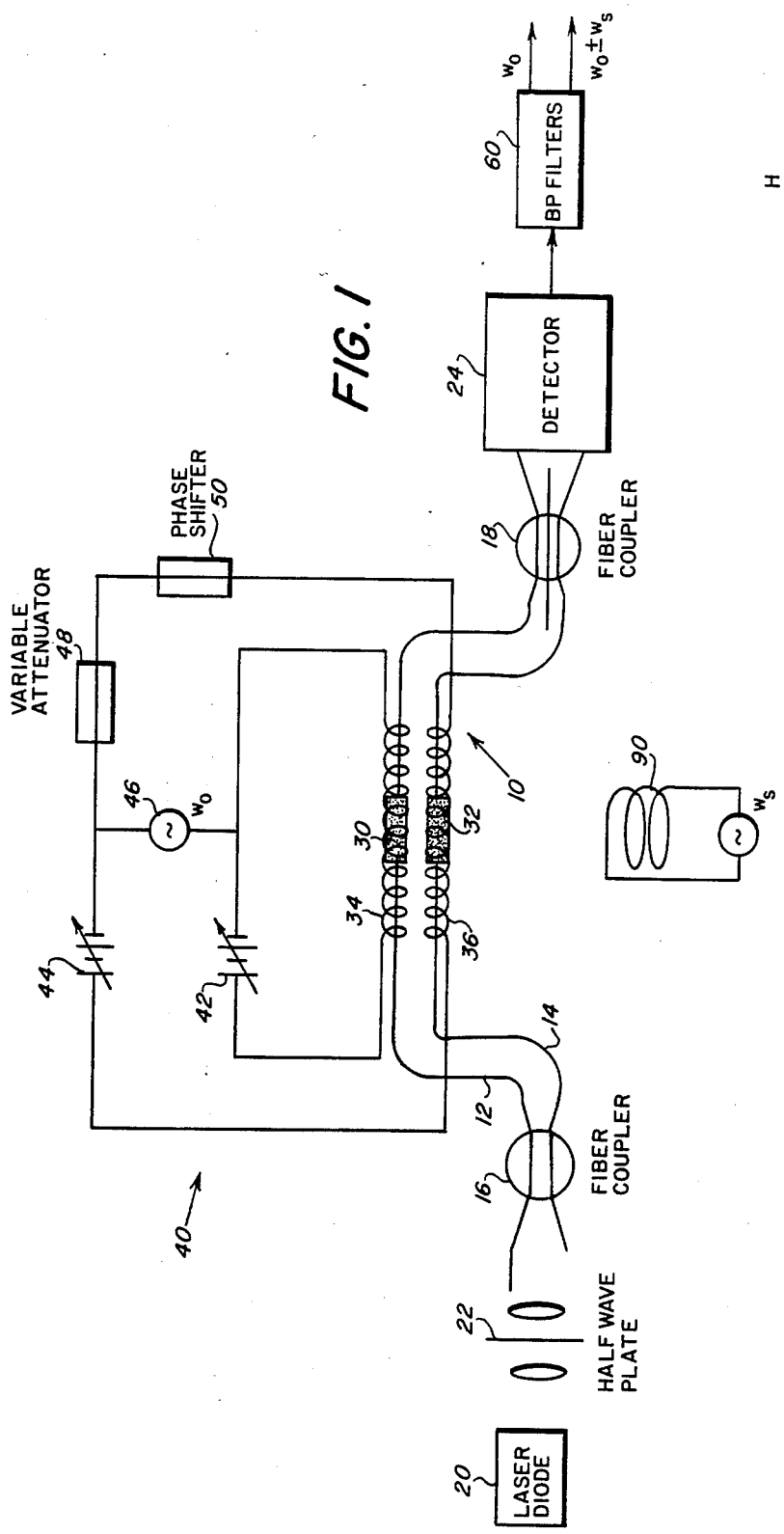
FIG. 1 is a schematic diagram of one embodiment of the present invention.

One embodiment of the fiber-optic interferometic magnetic gradiometer of the present invention is shown in FIG. 1. The gradiometer comprises a Mach-Zehnder interferometer formed by a pair of single-mode optical fibers 12 and 14 connected or coupled together at their ends by a pair of signal splitting fiber couplers 16 and 18 in the well-known manner. In the embodiment shown in FIG. 1 the coupler 16 is a 2×2 fiber input coupler and the coupler 18 is a 3×3 fiber output coupler. The signal mode fibers 12 and 14 used in the device built were ~10 cm in active length.

A light source 20 is disposed to direct light to the coupler 16. In the device constructed a single-mode laser diode at 0.83 μm wavelength was used to provide light to the interferometer. A half-wave plate 22 is shown in the figure for adjusting the polarization of the light applied by the light source 20 to the interferometer. However, note that if a pigtail laser is utilized as the light source 20, the light source 20 could be connected directly to the coupler 16 without the half-wave plate 22.

A standard active or passive detector circuit 24 may be utilized to detect the interferometer optical output signals from the coupler 18. The actual detection could be performed by conventional silicon p-i-n diodes. Typically, in order to obtain a linear signal, a detection scheme will be chosen to extract the signal at the optimum quadrature phase point between the two signals from the interferometer. One scheme for maintaining this quadrature point is the passive scheme set out in the article by Koo, Tveten, and Dandridge, "Passive Stabilization Scheme for Fiber Interferometer Using (3×3) Fiber Directional Couplers," *Applied Physics Letters,* Vol. 41, pp. 616–618, 1982, which is hereby incorporated by reference. This design provides a signal directly proportional to the phase regardless of whether the interferometer is drifting in and out of its quadrature setting. Thus, this detection scheme avoids the signal fading problem.

An active detecting scheme could also be used in order to maintain the system in phase quadrature. This active design would be implemented, for example, by placing a piezoelectric cylinder in one interferometer arm with a feedback signal to control that cylinder to maintain the quadrature phase shift. One potential problem with such an active design is that the electrical signal used for the feedback may act to perturb the H fields.

Dual arm magnetic sensing elements 30 and 32 for sensing the magnetic gradient may be formed in a variety of ways. By way of example, the magnetic sensing elements 30 and 32 may be formed by bonding or coating two equal lengths of the fiber arms 12 and 14 with a high-magnetostriction material. In the device actually constructed, the sensing elements were formed by bonding a length (10 cm) of bare fiber (with the plastic jacket removed) onto a strip (10 cm×0.2 cm×50 μm) of annealed metallic glass (Allied Chemical Corporation Type 2605 SC).

Magnetic biasing of the magnetic fiber sensor elements may be achieved via a variety of techniques. In the embodiment shown in FIG. 1, the magnetic sensor element 30 is disposed inside a first magnetic coil 34, while the magnetic sensor element 32 is disposed inside a second magnetic coil 36. Both the ac and dc amplitudes and the relative phase (ac only) of the bias magnetic fields to the magnetic sensor elements may then be adjustable for magnetic balancing by controlling the electrical ac and dc currents through the coils 34 and 36.

A control circuit 40 for controlling the ac and dc electrical currents through the coils may be implemented in a variety of embodiments. In the embodiment of FIG. 1, this control circuit 40 includes a first variable dc current source 42 which is connected in series with the magnetic coil 34, and a second variable dc current source 44 which is connected in series to the magnetic coil 36. The variable dc current sources 42 and 44 are utilized to fine tune the dc magnetic bias at the magnetic sensor elements 30 and 32, respectively.

A means 46 is also included in the control circuit 40 for providing a first ac signal at a frequency $w_o$ to the first magnetic coil 30 and a second ac signal to the second magnetic bias coil 36. In FIG. 1, this ac signal-providing means is implemented by an ac signal source 46 connected electrically across the series circuits for the first and second variable dc current sources 42 and 44. A variable attenuator 48 is disposed in one of the dc current source series circuits in order to adjust the relative ac amplitude of the ac signals applied to the magnetic bias coils 34 and 36. In FIG. 1 the variable attenuator 48 is disposed in the series circuit for the variable dc current source 44. Note that an amplifier could be used in place of the attenuator. A phase shifter 50 is also included for varying the relative phase between the ac signals applied to the magnetic bias coils 34 and 36. In FIG. 1 this phase shifter 50 is disposed in the series circuit for the variable dc current source 44.

The interferometer output which is a measure of the differential path length (ΔL) between the two fiber arms 12 and 14 can be represented by $$\Delta L = L_1 \sum_n C_{2n} H_1^{2n} - L_2 \sum_m K_{2m} H_2^{2m} \quad (1)$$

where $L_1$, $L_2$ are the lengths of the two sensing arms, $H_1$, $H_2$ are the magnetic field impinging on the respective arms, and C, K are material constants. For illustration, only the first order effect in one direction (isotropic case) is considered; then (1) becomes $$\Delta L = L_1 C H_1^2 - L_2 K H_2^2 \quad (2)$$

Let both $H_1$ and $H_2$ consist of a dc and an ac component such that $$H_1 = H_1^{dc} + H_{10} + H_{ext}^{dc} + H_1^{ac} + H_{ext}^{ac}$$

$$H_2 = H_2^{dc} + H_{20} + H_{ext}^{dc} + H_2^{ac} + H_{ext}^{ac} \Delta{-}H_{ext}^{dc} + \Delta H_{ext}^{ac}$$

where $H_{1,2}^{dc}$ are the imposed dc bias magnetic fields and $H_{1,2}^{ac}$ are the ac bias magnetic fields at frequency $w_o$ to achieve magnetic balancing, $H_{10}$ and $H_{20}$ are the dc ambient and earth magnetic fields seen by the two arms, respectively, $H_{ext}^{dc}$, $H_{ext}^{ac}$ are the dc external field and the ac external field at frequency $w_s$, and $\Delta H_{ext}^{dc}$, $\Delta H_{ext}^{ac}$ are the external dc and ac magnetic-field gradients (the gradients to be measured). In the presence of external dc and ac magnetic-field gradients in addition to the applied bias magnetic fields, (2) becomes $$\Delta L = L_1 C [H_1^{dc} + H_{10} + H_{ext}^{dc} + H_1^{ac} + H_{ext}^{ac}]^2 - \quad (3)$$
$$L_2 K [H_2^{dc} + H_{20} + H_{ext}^{dc} + \Delta H_{ext}^{dc} + H_2^{ac} + H_{ext}^{ac} + \Delta H_{ext}^{ac}]^2.$$

Expanding (3) by performing the squaring operation and collecting terms according to their frequency components, a signal component is obtained at the ac bias magnetic frequency $w_o$ $$\Delta L \Big|_{w=w_o} = 2 [L_1 C(H_1^{dc} + H_{10})H_1^{ac} - L_2 K(H_2^{dc} + H_{20})H_2^{ac} + \quad (4)$$
$$2 [L_1 C H_1^{ac} - L_2 K H_2^{ac}] H_{ext}^{dc} - 2 L_2 K H_2^{ac} \Delta H_{ext}^{dc}$$

and a signal component is obtained at the mixed frequencies ($w_o \pm w_s$) between bias ($w_o$) and external ($w_s$) ac magnetic fields $$\Delta L \Big|_{w=w_o \pm w_s} = 2[L_1 C H_1^{ac} - L_2 K H_2^{ac}] H_{ext}^{ac} - 2 L_2 K [H_2^{ac} \Delta H_{ext}^{ac}]. \quad (5)$$

The balance condition of the magnetic gradiometer can be experimentally set such that $$L_1 C H_1^{ac} - L_2 K H_2^{ac} = 0$$

and $$H_2^{dc} + H_{20} = 0$$
$$H_1^{dc} + H_{10} = 0 \quad (6)$$

meaning that different ac magnetic biases are applied to the two sensor arms 12 and 14 to compensate for any material response differences and that dc magnetic biases are used to null off earth's magnetic fields. Under these balanced conditions, the interferometer spectral outputs represented by (4) and (5) will simplify to become $$\Delta L |_{w=w_o} = -2 L_2 K H_2^{ac} \Delta H_{ext}^{dc} \quad (7)$$

and $$\Delta L |_{w=w_o \pm w_s} = -2 L_2 K H_2^{ac} \Delta H_{ext}^{ac} \quad (8)$$

Note that the $w_o$ term depends only on the gradient of the dc field $\Delta H_{ext}^{dc}$ and the $w_o \pm w_s$ terms depends only on the gradient of the ac field $\Delta H_{ext}^{ac}$ which indicates that both dc and ac gradient magnetic fields can be directly measured by this ac balancing and trimming technique.

In order to directly measure the $w_o$ term and the $w_o \pm w_s$ term, either a spectriometer or a set of bandpass filters may be conveniently utilized at the output of the detector 24. In FIG. 1, a bandpass filter circuit 60 is shown for measuring the $w_o$ and the $w_o \pm w_s$ signal components.

From the above, it can be seen that it is essential to initially balance the gradiometer such that $$L_1 C H_1^{ac} - L_2 K H_2^{ac} = 0$$
$$H_2^{dc} + H_{20} = 0$$
$$H_1^{dc} + H_{10} = 0.$$

This balanced conditioned may be accomplished by first individually adjusting $H_1^{dc}$ and $H_2^{dc}$ to null out the environmental and earth magnetic fields $H_{10}$ and $H_{20}$. This adjustment is achieved for $H_1^{dc}$ by applying an ac electrical current only to the magnetic bias coil 34 to obtain an ac magnetic bias coil 34 to obtain an ac magnetic bias field at frequency $w_o$. During this time there is essentially a zero ac magnetic field at the magnetic bias coil 36 (due to proper adjustment of the attenuator 48). Also, this adjustment is done with no external dc magnetic field component $H_{ext}^{dc}$ present and no dc gradient component $\Delta H_{ext}^{dc}$ present. From equation (4) it can be seen that only the $(H_1^{dc} + H_{10}) H_1^{ac}$ component will then be present as a signal component at the frequency $w_o$ at the bandpass filter 60. Accordingly, $H_1^{dc}$ can be adjusted via the variable dc current source 42 to minimize the gradiometer output at the frequency $w_o$.

Likewise, for $H_2^{dc}$, an ac electrical current may be applied only to the magnetic coil 36 to obtain an ac magnetic bias field at frequency $w_o$. For the $H_2^{dc}$ adjustment, there will be essentially a zero ac magnetic field at the bias coil 34 and no external dc magnetic field component $H_{ext}^{dc}$ or external dc magnetic field gradient $\Delta H_{ext}^{dc}$. From equation (4) it can be seen that only the $(H_2^{dc} + H_{20}) H_2^{ac}$ term is present as a signal component at the frequency $w_o$ at the bandpass filter 60. Accordingly, $H_2^{dc}$ can be adjusted via the variable dc current source 44 to minimize the gradiometer output at the frequency $w_o$.

At this point, with $H_1^{dc}$ and $H_2^{dc}$ set via the dc current sources 42 and 44, respectively, the ac magnetic field bias $H_1^{ac}$ and $H_2^{ac}$ are activated simultaneously via the ac current source 46 and their relative amplitudes are adjusted for minimal gradiometer output at the frequency $w_o$. From equation (4), since $H_1^{dc}$ and $H_2^{dc}$ have already been adjusted so that $H_1^{dc} + H_{10} = 0$ and $H_2^{dc} + H_{20} = 0$, it can be see that only the term $$2(L_1 C H_1^{ac} - L_2 K H_2^{ac}) H_{ext}^{dc}$$

will be present at the bandpass filter 60 output at the frequency $w_o$. In order to balance this term in real time to approximately zero, a spatially uniform external dc magnetic field $H_{ext}^{dc}$ is required, but no dc magnetic gradient $\Delta H_{ext}^{dc}$ is permitted.

Figure 2:
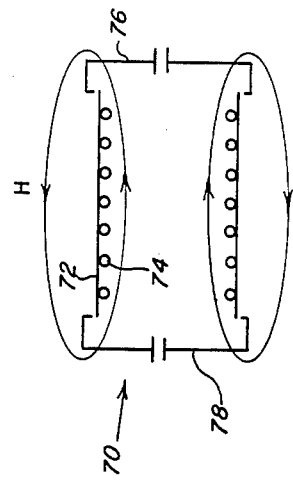
FIG. 2 is a schematic diagram of device for generating a uniform external magnetic field.

Such a uniform dc magnetic field can be obtained, across both of the magnetic sensor elements 30 and 32, for example, simply by placing the entire circuit of FIG. 1 in some form of uniform magnetic field shielded chamber. Such a chamber 70 is shown by way of example, in FIG. 2. This chamber 70 simply comprises a hollow cylindrical metal casing 72 with high magnetic permeability and a set of coils 74 disposed inside the casing 72 and wound so as to generate uniform magnetic field lines axially within the cylindrical casing.

The set of coils 74 may be energized by a small dc current in order to generate the uniform dc magnetic field. The circuit of FIG. 1 is preferably disposed so that the axis of the coil 74 is parallel and approximately coaxial with the axes of the magnetic bias coils 34 and 36. Note that metallic end cap shields 76 and 78 may be disposed at each end of the casing 72 to provide additional shielding.

With this uniform dc magnetic field $H_{ext}^{dc}$, the relative amplitude of the ac magnetic bias fields $H_1^{ac}$ and $H_2^{ac}$ may be adjusted via the variable attenuator 48 in order to obtain a minimal gradiometer output at the bandpass filter 60 at frequency $w_o$.

Figure 3:
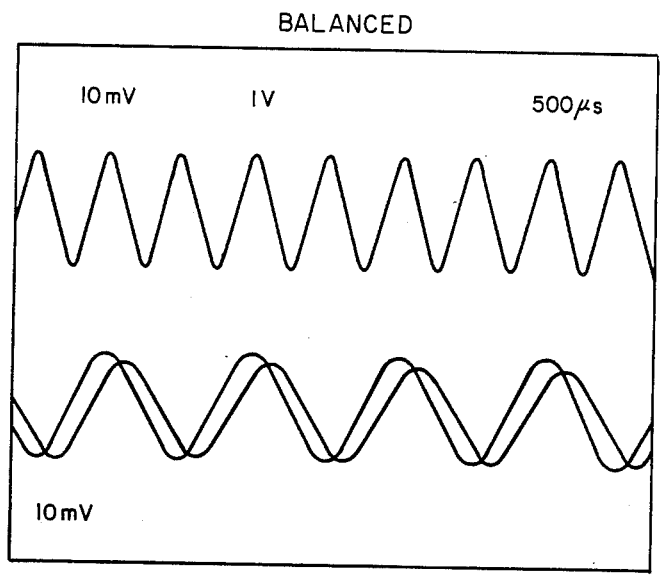
FIG. 3 is an oscillogram showing the magnetic gradiometer output (upper trace) and the electric currents to the magnetic bias coils (lower trace) when the gradiometer is magnetically balanced.
Figure 4:
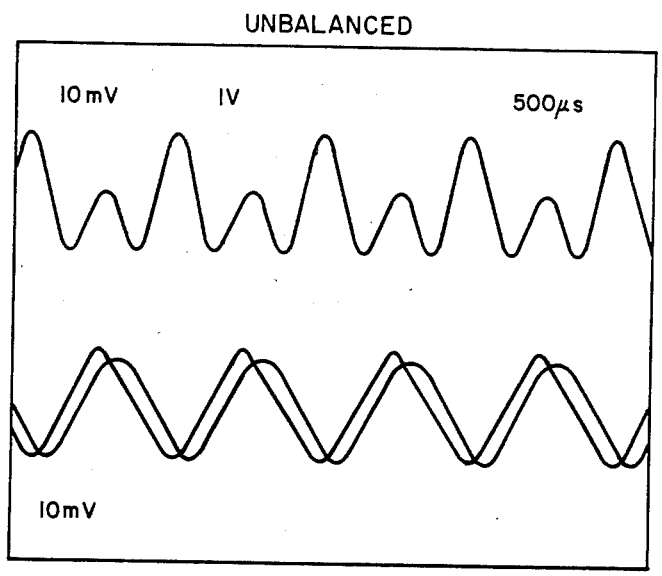
FIG. 4 is an oscillogram showing the magnetic gradiometer output (upper trace) and the electric currents to the magnetic bias coils (lower trace) when the gradiometer is slightly unbalanced.
Figure 5:
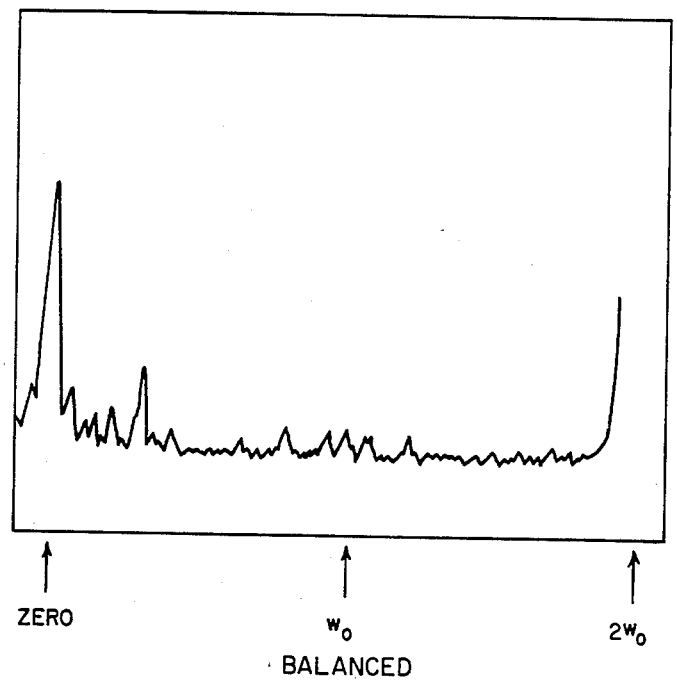
FIG. 5 is the spectral output of the magnetic gradiometer when it is magnetically balanced (minimal signal at the ac bias magnetic-field frequency $w_o$).

FIG. 3 shows the experimental results of the balanced condition as measured on an oscilloscope at the output of the detector 24. Here the top trace is the interferometer output and the lower traces are the electrical currents to the bias magnetic coils 34 and 36. For comparison, FIG. 4 shows results for an unbalanced case where only one of the bias magnetic coils 34 and 36 is activated. Note that the symmetry of the upper trace in FIGS. 3-4 is an indication of the balance condition. The exact balanced condition can best be monitored on a spectrum analyzer as shown in FIG. 5. The bias ac magnetic field was applied at the frequency $w_o = 860$ Hz (randomly chosen). When perfectly balanced (i.e., $L_1 C H_1^{ac} - L_2 K H_2^{ac} = 0$) there is no signal component (background trace in FIG. 5) at $w_o$ as predicted by (4) where $\Delta H_{ext}^{dc}$ is absent. When the magnetic gradiometer is unbalanced, the signal at $w_o$ (FIG. 5) is a measure of $(L_1 C H_1^{ac} - L_2 K H_2^{ac}) H_{ext}^{dc}$ where $H_{ext}^{dc}$ is the environmental dc magnetic field.

Figure 6:
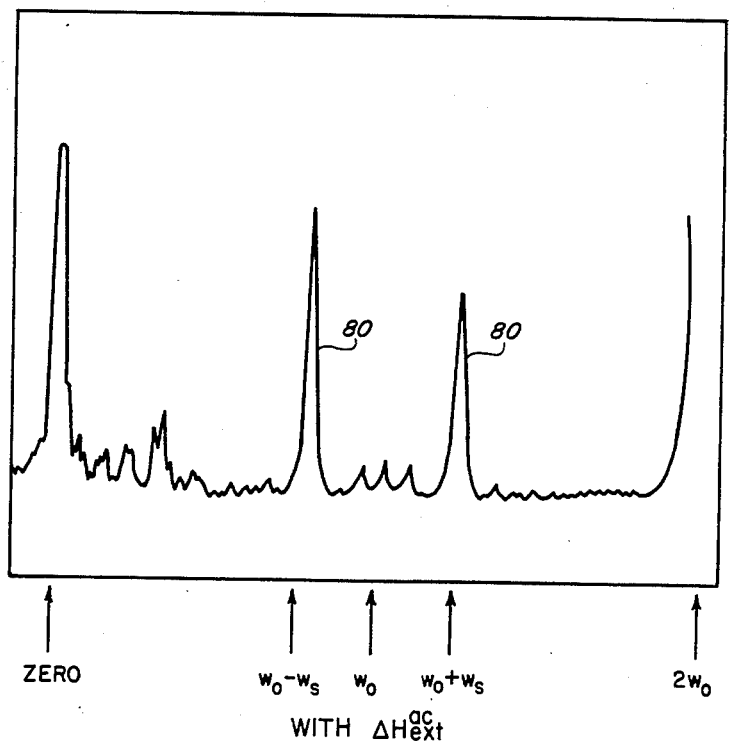
FIG. 6 is the spectral output of the magnetic gradiometer when it is balanced at frequency $w_o$ and then is exposed to an external ac magnetic field gradient $\Delta H_{ex}$-$^{ac}$ at a frequency $w_s$ (the signal components at the frequencies ($w_o \pm w_s$) are measures of this ac magnetic field gradient).
Figure 7:
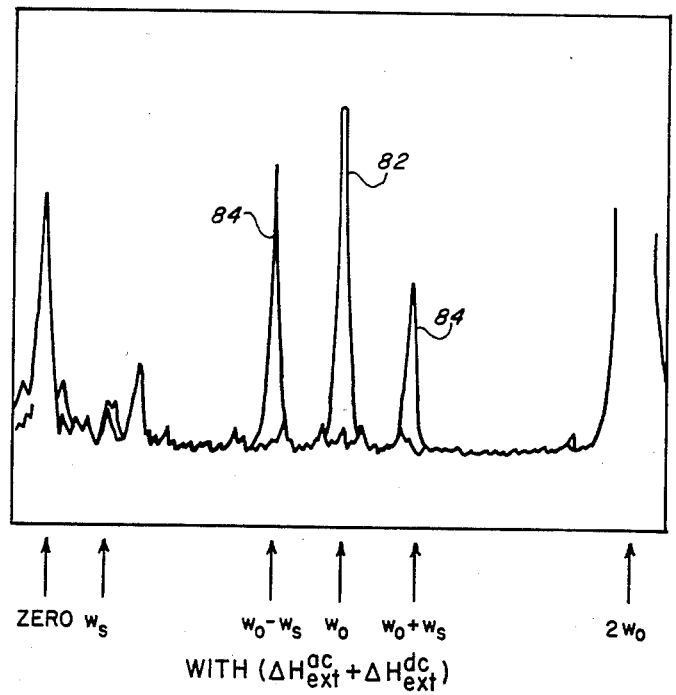
FIG. 7 is the spectral output of the magnetic gradiometer when it is balanced at frequency $w_o$ and is then exposed both to an external dc magnetic-field gradient $\Delta H_{ext}^{dc}$ and to an ac magnetic-field gradient $\Delta H_{ext}^{ac}$. The signal components at the frequency $w_o$ is a measure of the dc magnetic field gradient $\Delta H_{ext}^{dc}$, while the signal components at the frequencies $w_o \pm w_s$ are measures of the ac magnetic-field gradient $\Delta H_{ext}^{ac}$.

The gradient magnetic-field measuring capability of this gradiometer is observed by exposing the gradiometer in its balanced state to an external gradient magnetic field. As predicted by (7) and (8), the dc and ac gradient magnetic fields are indicated by the presence of spectral signals at $w_o$ and $w_o \pm w_s$, respectively. FIG. 6 shows the interferometer spectral output 80 in the presence of an ac gradient magnetic field ($\Delta H_{ext}^{ac}$) at $w_s = 200$ Hz. Similarly, FIG. 7 shows the spectrum blips 82 and 84 at the frequencies $w_o$ and $w_o \pm w_s$ for the case where both dc and ac gradient magnetic fields are present. The amplitudes of these signal blips 80, 82 and 84 in FIGS. 6 and 7 are proportional to the ac and dc gradients being measured, as noted previously. Note that the signal blips 80 in FIG. 6 and 84 in FIG. 7 at the frequencies $w_o \pm w_s$ are unequal due to a dc phase difference between the two frequencies $w_o$ and $w_s$. Proper calibration will take this into account. The results illustrated by the above figures demonstrate the principle of an ac balancing technique to measure both dc and ac magnetic-field gradients.

The gradiometer can be calibrated using a signal magnetic coil 90 for generating ac and dc magnetic field gradients at the frequency $w_s$. As shown in FIG. 1, this signal calibrating coil 90 is disposed perpendicular to the axis of the magnetic bias coils 34 and 36. The magnetic field strengths from this signal coil 90 are a function of its ac and dc drive currents and have been determined by conventional techniques (using commercial magnetic probes). The actual calibration procedure for the gradiometer is to first carry out the aforementioned dc and ac balancing procedures. Then with $H_1^{ac}$ fixed and the signal magnetic coil 90 on (i.e., $H_{ext}^{dc,ac} \neq 0$, and $\Delta H_{ext}^{dc,ac} \neq 0$) $H_2^{ac}$ is scanned amplitude-wise. Then, the magnetic field strengths from the signal coil 90 are increased and the amplitude of $H_2^{ac}$ is scanned again.

Figure 8:
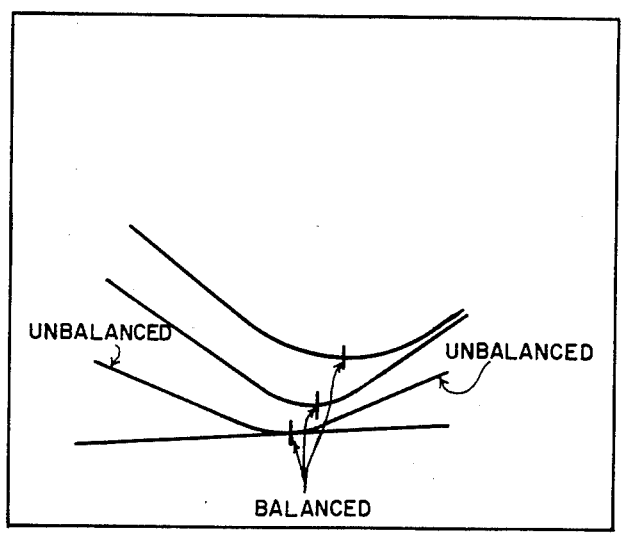
FIG. 8 is a oscillogram showing the magnetic gradiometer output (vertical axis) as a function of increasing ac bias magnetic field (horizontal axis) to one arm of the sensor for a fixed external dc magnetic field gradient. Different traces correspond to different external magnetic field gradients. The amount of shifting of the turning points from one trace to another is a measure of the magnetic-field gradient sensitivity.

From a set of scans as shown in FIG. 8 the magnetic-field gradient sensitivity of the gradiometer can be determined. In FIG. 8, each trace corresponds to a single scan of the gradiometer output at the ac biasing field frequency $w_o$ as the strength of $H_2^{ac}$ is scanned. Different traces correspond to different external magnetic fields ($H_{ext}^{ac,dc}$) generated by the reference Helmholtz coils. The concept of this calibration technique is to exploit the turning of the gradiometer output signal level away from its minimum as the ac magnetic bias field to one of the two magnetic elements 30 or 32 is increased beyond that required for balancing. From equations (4) and (7), it can be seen that if there is no magnetic-field gradient ($\Delta H_{ext}^{dc,ac} = 0$), there will be no shifting of turning points (contrary to results shown in FIG. 8) toward larger $H_2^{ac}$ as $H_{ext}^{dc,ac}$ is increased. The phase shifting capability of each of the sensor elements with respect to bias magnetic fields $H_{1,2}^{ac}$ and $H_{ext}^{dc,ac}$ are measured by techniques described in the previously referenced Koo and Siegel, Jr. article in Optics Letters, 1982. The $\Delta H_2^{ac}$ corresponding to the shifts of turning points (FIG. 8) for a given $H_{ext}^{dc,ac}$ is a measure of the $\Delta H_{ext}^{ac,dc}$. With our present gradiometer, an extracted sensitivity of 0.1 gamma per centimeter of sensor separation for a meter of magnetically active sensor fiber was obtained. Higher sensitivities are possible with further refinement of the gradiometer.

It should be noted that the variable dc current sources 44 and 42 and the variable attenuator 48 and phase shifter 50 may be adjusted either manually or automatically to control the ac and dc magnetic field bias.

In conclusion, a fiber-optic magnetic gradiometer capable of measuring both dc and ac magnetic-field gradients has been successfully designed and demonstrated. The present sensor sensitivity is 0.1 gamma ($10^{-6}$ Oe) per centimeter of sensor separation for 1 m of fiber. Unique features include the ability to balance and trim the respective arms of the gradiometer on a real-time basis as well as to calibrate the device in the presence of nonzero magnetic-field gradients. This balancing and fine-tuning may be carried out in situ after the device is assembled. This technique can be readily incorporated with active or passive stabilization schemes commonly used in fiber-optic interferometry.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A fiber-optic magnetic gradiometer for measuring both ac and dc magnetic-field gradients, comprising:
   an interferometer including a first optical fiber arm, a second optical fiber arm, each having first and second ends, input coupling means for coupling light into one end of said first and second arms, and output coupling means for coupling light together at the second ends of first and second arms;
   first magnetic means disposed around a portion of said first arm for changing the length of said first arm in accordance with a magnetic field;
   first variable magnetic bias means for applying first dc and ac magnetic bias fields to said first magnetic means;

second magnetic means disposed around a portion of said second arm for changing the length of said second arm in accordance with a magnetic field;

second variable magnetic bias means for applying second dc and ac magnetic bias fields to said second magnetic means;

a control circuit for controlling the dc and ac magnetic bias fields being applied by said first and second variable magnetic bias means;

said first and second magnetic bias means acting to balance out ambient environmental magnetic fields and to compensate for unequal lengths of said first and second arms and for unequal responses by said first and second magnetic means to magnetic fields;

means for detecting the light coupled together at said output coupling means; and means for obtaining the signal components from the output of said detecting means at the ac magnetic bias frequency $W_o$ in order to obtain a signal proportional to the external dc gradient magnetic field, and for obtaining the signal components from the output of said detecting means at one of the frequencies $w_o \pm w_s$, where $w_s$ is the external ac magnetic field frequency in order to obtain a signal proportional to the external ac gradient magnetic field.

2. A gradiometer as defined in claim 1, wherein said first and second variable magnetic bias means each include a magnetic coil disposed around their respective magnetic means for applying dc and ac magnetic bias fields thereto.

3. A gradiometer as defined in claim 2, wherein said control circuit comprises a first variable dc current source for applying current to said magnetic coil in said first variable magnetic bias means;

a second variable dc current source for applying a current to said magnetic coil in said second variable magnetic bias means; and means for providing a first ac signal at the frequency $w_o$ to said first variable magnetic bias means and for providing a second ac signal at the frequency $w_o$ to said second variable magnetic bias means.

4. A gradiometer as defined in claim 3, wherein said ac signal providing means includes means for varying the amplitude of at least one of said first and second ac signals; and a phase shifter for varying the relative phase between said first and second ac signals.

5. A gradiometer as defined in claim 3, further comprising:

means for creating a uniform dc magnetic field at said first and second variable magnetic bias means in order to facilitate calibration of said first and second ac signal providing means.

6. A gradiometer as defined in claim 5, wherein said uniform dc magnetic field creating means comprises:

a cylindrical metal-walled chamber; and a coil disposed within said chamber for creating a uniform dc magnetic field therein.

7. A gradiometer as defined in claim 6, wherein said first and second magnetic means comprise magnetostrictive material disposed around a portion of their respective optical fiber arms.

8. A gradiometer as defined in claim 4, wherein said ac signal providing means is electrically connected across said first and second variable dc current sources.

9. A method for calibrating a fiber-optic magnetic gradiometer for measuring both ac and dc magnetic-field gradients including an interferometer including a first optical fiber arm, a second optical fiber arm, each having first and second ends, input coupling means for coupling light into one end of said first and second arms, and output coupling means for coupling light together at the second ends of first and second arms;

first magnetostrictive means disposed around a portion of said first arm for changing the length of said first arm in accordance with a magnetic field;

first variable magnetic bias means for applying first dc and ac magnetic bias fields to said first magnetostrictive means;

second magnetostrictive means disposed around a portion of said second arm for changing the length of said second arm in accordance with a magnetic field;

second variable magnetic bias means for applying second dc and ac magnetic bias fields to said second magnetostrictive means;

a control circuit for controlling the dc and ac magnetic bias fields being applied by said first and second variable magnetic bias means;

said first and second magnetic bias means acting to balance out ambient environmental magnetic fields and to compensate for unequal lengths of said first and second arms and for unequal responses by said first and second magnetic means to magnetic fields;

means for detecting the light coupled together at said output coupling means; and means for obtaining the signal components from the output of said detecting means at the ac magnetic bias frequency $w_o$ in order to obtain a signal proportional to the external dc gradient magnetic field, and for obtaining the signal components from the output of said detecting means at one of the frequencies $w_o \pm w_s$, where $w_s$ is the external ac magnetic field frequency in order to obtain a signal proportional to the external ac gradient magnetic field, the method comprising the steps of:

applying only a first ac magnetic bias field at frequency $w_o$ to said first magnetostrictive means with the second ac magnetic bias field being minimized and no external dc magnetic field other than ambient magnetic fields;

adjusting the first dc magnetic bias field to a first null field until the output at the frequency $w_o$ from said signal component obtaining means is approximately zero;

applying only a second ac magnetic bias field at frequency $w_o$ to said second magnetostrictive means with said first ac magnetic bias field being approximately zero and no external dc magnetic field other than ambient magnetic fields;

adjusting the second dc magnetic bias field to a second null field until the output at the frequency $w_o$ from said signal component obtaining means is approximately zero;

disposing said first and second magnetostrictive means within an approximately uniform dc magnetic field region with no dc magnetic field gradients with said first and second dc magnetic bias fields at their previously adjusted first and second null fields;

adjusting said first and second ac magnetic bias fields until the output signal at frequency $w_o$ from said signal component obtaining means is approximately zero.

* * * * *